(12) United States Patent
Hanley et al.

(10) Patent No.: US 10,450,189 B2
(45) Date of Patent: Oct. 22, 2019

(54) MEMS DEVICES AND PROCESSES

(71) Applicant: Cirrus Logic International Semiconductor Ltd., Edinburgh (GB)

(72) Inventors: Tom Hanley, Edinburgh (GB); Timothy John Brosnihan, Austin, TX (US); Euan James Boyd, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/810,592

(22) Filed: Nov. 13, 2017

(65) Prior Publication Data

US 2018/0148315 A1   May 31, 2018

Related U.S. Application Data

(60) Provisional application No. 62/427,318, filed on Nov. 29, 2016.

(30) Foreign Application Priority Data

Dec. 19, 2016   (GB) .................................. 1621569.1

(51) Int. Cl.
*B81B 3/00* (2006.01)
*B81C 1/00* (2006.01)
(Continued)

(52) U.S. Cl.
CPC .......... *B81B 3/001* (2013.01); *B81C 1/00984* (2013.01); *H04R 9/08* (2013.01);
(Continued)

(58) Field of Classification Search
CPC ............ B81B 3/001; B81B 2201/0278; B81B 2201/0285; B81B 2203/033;
(Continued)

(56) References Cited

U.S. PATENT DOCUMENTS 5,552,659 A * 9/1996 Macaulay ............... H01J 3/022
313/309
7,023,066 B2 * 4/2006 Lee ....................... B81B 3/0072
257/415

(Continued)

FOREIGN PATENT DOCUMENTS

FR        2806398 A1 *  9/2001   ......... B81C 1/00626
TW     201637989 A    11/2016

OTHER PUBLICATIONS

Combined Search and Examination Report, UKIPO, Application No. GB1621569.1, dated Apr. 19, 2017.
(Continued)

*Primary Examiner* — Fan S Tsang
*Assistant Examiner* — Angelica M McKinney
(74) *Attorney, Agent, or Firm* — Jackson Walker L.L.P.

(57) ABSTRACT

The application describes a MEMS transducer comprising a substrate having a cavity. The transducer exhibits a membrane layer supported relative to the substrate to define a flexible membrane. An upper surface of the substrate comprises an overlap region between the edge of the cavity and a perimeter of the flexible membrane where the membrane overlies the upper surface of the substrate. At least one portion of the overlap region of the upper surface of the substrate is provided with a plurality of recesses. The recesses are defined so as to extend from the edge of the cavity towards the perimeter of the flexible membrane.

19 Claims, 17 Drawing Sheets

(51) Int. Cl.
  *H04R 9/08* (2006.01)
  *H04R 19/04* (2006.01)
  *H04R 19/00* (2006.01)
  *H04R 31/00* (2006.01)

(52) U.S. Cl.
  CPC ...... *H04R 19/04* (2013.01); *B81B 2201/0257* (2013.01); *B81B 2203/033* (2013.01); *B81B 2203/0376* (2013.01); *B81B 2207/012* (2013.01); *B81C 2201/115* (2013.01); *H04R 19/005* (2013.01); *H04R 31/006* (2013.01); *H04R 2201/003* (2013.01)

(58) Field of Classification Search
  CPC .... B81B 2203/0338; B81B 2203/0346; B81B 2203/0353; B81B 2203/0376; B81B 2203/0323; B81B 2201/0257; B81B 2201/0264; B81B 2201/0271; B81B 2201/003; H04R 9/08; H04R 19/013; H04R 19/04; H04R 19/005; H04R 19/016
  See application file for complete search history.

(56) References Cited

U.S. PATENT DOCUMENTS

| | | | | |
|---|---|---|---|---|
| 8,265,309 | B2* | 9/2012 | Zhang | H04R 19/005 381/171 |
| 8,731,220 | B2* | 5/2014 | Zhang | H04R 19/005 381/174 |
| 9,591,408 | B2* | 3/2017 | Dehe | B81B 3/0078 |
| 9,728,653 | B2* | 8/2017 | Dehe | H04R 19/005 |
| 2003/0094047 | A1* | 5/2003 | Torkkeli | B81C 1/00158 73/716 |
| 2008/0104825 | A1* | 5/2008 | Dehe | H04R 19/005 29/594 |
| 2008/0122453 | A1* | 5/2008 | Hunter | G01D 3/032 324/661 |
| 2008/0247573 | A1* | 10/2008 | Pedersen | H04R 19/005 381/174 |
| 2009/0278217 | A1* | 11/2009 | Laming | B81C 1/00158 257/419 |
| 2011/0235829 | A1* | 9/2011 | Yang | H04R 19/04 381/174 |
| 2011/0255716 | A1* | 10/2011 | Ge | H04R 19/04 381/174 |
| 2013/0221453 | A1 | 8/2013 | Dehe et al. | |
| 2015/0041930 | A1 | 2/2015 | Kim et al. | |
| 2015/0369653 | A1* | 12/2015 | Inoue | G01H 11/06 381/113 |
| 2015/0382091 | A1* | 12/2015 | Kim | H04R 19/005 381/174 |
| 2018/0035228 | A1* | 2/2018 | Boyd | B81B 3/0021 |
| 2018/0282149 | A1* | 10/2018 | Smith | B06B 1/0292 |

OTHER PUBLICATIONS

Examination Opinion and Search Report of the Taiwan Intellectual Property Office, TW Application No. 106137186, dated Apr. 16, 2019.

Examination Report under Section 18(3), United Kingdom Intellectual Property Office, Application No. GB1621569.1, dated Aug. 20, 2019.

* cited by examiner

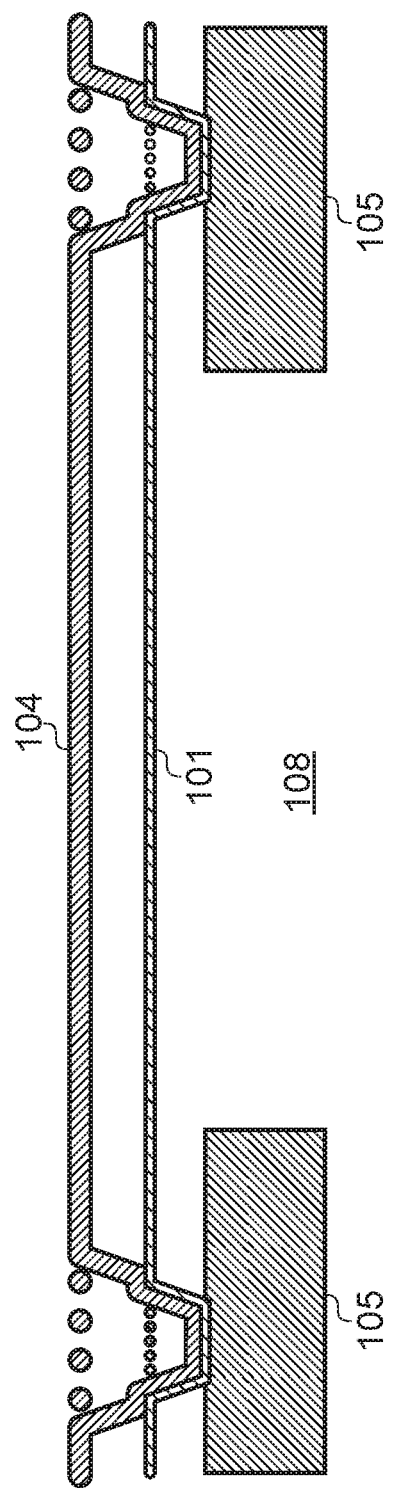

MEMS DEVICES AND PROCESSES

TECHNICAL FIELD

The embodiments of the present invention relate to micro-electro-mechanical system (MEMS) devices and processes, and in particular to a MEMS device and process relating to a transducer, for example a capacitive microphone.

BACKGROUND

Various MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing, and wherein a substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 103 is mechanically coupled to the flexible membrane, and together they form a first capacitive plate of the capacitive microphone device. A second electrode 102 is mechanically coupled to a generally rigid structural layer or backplate 104, which together form a second capacitive plate of the capacitive microphone device. In the example shown in FIG. 1a the second electrode 102 is embedded within the backplate structure 104.

The capacitive microphone is formed on a substrate 105, for example a silicon wafer, which may have upper and lower oxide layers 106, 107 formed thereon. A cavity or through-hole 108 in the substrate and in any overlying layers (hereinafter also referred to as a substrate cavity) is provided below the membrane, and may be formed for example using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

A plurality of holes, hereinafter referred to as bleed holes 111, connect the first cavity 109 and the second cavity 110.

A further plurality of holes, hereinafter referred to as acoustic holes 112, are arranged in the back-plate 104 so as to allow free movement of air molecules through the back plate, such that the second cavity 110 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume.

In other applications, the microphone may be arranged so that sound may be received via the substrate cavity 108 in use, i.e. the substrate cavity forms part of an acoustic channel to the membrane and part of the front volume. In such applications the backplate 104 forms part of the back-volume which is typically enclosed by some other structure, such as a suitable package.

It should also be noted that whilst FIG. 1 shows the backplate 104 being supported on the opposite side of the membrane to the substrate 105, arrangements are known where the backplate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 103 and the upper electrode 102 is correspondingly altered, giving rise to a change in capacitance between the two electrodes that is subsequently detected by electronic circuitry (not shown). The bleed holes allow the pressure in the first and second cavities to equalize over a relatively long timescale (in acoustic frequency terms) which reduces the effect of low frequency pressure variations, e.g. arising from temperature variations and the like, but without significantly impacting on sensitivity at the desired acoustic frequencies.

One skilled in the art will appreciate that MEMS transducers are typically formed on a wafer before being singulated. Increasing it is proposed that at least some electronic circuitry, e.g. for read-out and/or drive of the transducer, is also provided as part of an integrated circuit with the transducer. For example a MEMS microphone may be formed as an integrated circuit with at least some amplifier circuitry and/or some circuitry for biasing the microphone. The footprint of the area required for the transducer and any circuitry will determine how many devices can be formed on a given wafer and thus impact on the cost of the MEMS device. There is therefore a general desire to reduce the footprint required for fabrication of a MEMS device on a wafer.

In addition to be suitable for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound port for a MEMS microphone on one face of the device. If the device falls onto that face, some air may be compressed by the falling device and forced into the sound port. This may result in a high pressure impulse incident on the transducer. It has been found that in conventional MEMS transducers high pressure impulses can potentially lead to damage of the transducer.

FIG. 2 illustrates a cross-sectional view through a typical transducer structure. The transducer structure comprises a membrane 101 which is moveable during use in relation to a rigid backplate 104. The membrane 101 and backplate 104 are supported by a substrate 105, the substrate 105 comprising a cavity or through-hole 108. Electrodes and other features are not shown in FIG. 2 for clarity purposes.

Referring to FIG. 3, during movement of the membrane 101 during use, and in particular during high input acoustic pressure, or extreme conditions such as a mobile device being dropped, it is possible that the membrane 101 makes contact with the substrate 105 which provides support for the membrane. For example, the membrane 101 can make contact with a peripheral edge of the substrate 105 that forms the cavity within the substrate, as illustrated by the arrow 30. This can result in the membrane becoming damaged.

This problem may be particularly apparent in transducer configurations—such as is illustrated in FIG. 4—having a generally square-shaped membrane layer wherein the membrane layer comprises an active central region 301 and a plurality of support arms 303 which extend laterally from the active central region for supporting the active central region of the membrane. In this case it will be appreciated that the edges of the supporting arms 303 may be particularly vulnerable to damage if the supporting arms of the active membrane area make contact with the edge 308 of the substrate cavity.

Furthermore, the occurrence of membrane stiction—whereby the membrane becomes permanently or temporarily adhered to the substrate—may also be observed following a high pressure event which causes the membrane to make contact with the substrate. This is illustrated in FIGS. 5a and 5b. Specifically, in FIG. 5a the membrane 101 is suspended freely with respect to the substrate 105. However, in FIG. 5b the membrane 101 has become adhered to the upper surface of the substrate 105 following e.g. a high pressure event. It will be appreciated that stiction arises when e.g. atomic-level attractive forces and/or capillary forces and/or chemical bonding arising between the membrane and the substrate exceed restoring forces e.g. arising from the elasticity of the membrane which act to restore the membrane to an equilibrium position. Membrane stiction may significantly degrade the performance of the transducer or may even result in the failure of the transducer.

SUMMARY

Aspects of the present invention described herein are generally concerned with improving the efficiency and/or performance of a transducer structure. Aspects of the present invention are particularly concerned with alleviating problems associated with stiction of the membrane to the substrate. Further aspects of the present invention may be additionally or alternatively concerned with mitigating the risk of membrane damage during e.g. a high pressure impulse.

According to a first aspect of the present invention there is provided a MEMS transducer comprising a substrate having a cavity. The transducer further comprises a membrane layer supported relative to the substrate to define a flexible membrane. An upper surface of the substrate comprises an overlap region between the edge of the cavity and a perimeter of the flexible membrane where the membrane overlies the upper surface of the substrate, wherein at least one portion of the overlap region of the upper surface of the substrate is provided with a plurality of recesses, each of the recesses being defined so as to extend from the edge of the cavity towards the perimeter of the flexible membrane.

Thus, at least one portion of the upper surface of the substrate is provided with a plurality of recesses. A recess can be considered to be a region where the upper surface of the substrate is lower than an adjacent upper surface region of the substrate. Thus, the plurality of recesses may define a series of lower regions which are provided between adjacent higher regions in the upper surface of the substrate.

Each of the recesses extend from the edge of the cavity towards the mount structure. Thus, a given recess may be considered to intersect the cavity. The plurality of recesses may comprise a plurality of channels. Each of the channels may be considered to comprise a terminating end portion that intersects the edge of the cavity and extends into the overlap region of the substrate.

The membrane may be substantially circular in shape. Alternatively, the membrane may be generally square or rectangular in shape. The cavity may be substantially circular in shape. The cavity may comprise a through-hole through the substrate. The cavity may be formed in a surface of the substrate corresponding to a side on which the membrane is supported. The cavity may be formed using a sacrificial layer or using an etching process.

Features of any given aspect may be combined with the features of any other aspect and the various features described herein may be implemented in any combination in a given embodiment.

Associated methods of fabricating a MEMS transducer are provided for each of the above aspects and examples described herein.

BRIEF DESCRIPTION OF THE DRAWINGS

For a better understanding of the present invention, and to show how it may be put into effect, reference will now be made, by way of example to the accompanying drawings, in which:

FIG. 2 illustrates a cross-sectional view through a MEMS transducer structure;

FIGS. 9a and 9b illustrate a partial perspective view and cross section view of the example shown in FIG. 7a;

DETAILED DESCRIPTION

It will be appreciated that, in the membrane layer of a MEMS transducer, a material is said to be under stress when its atoms are displaced from their equilibrium positions due to the action of a force. Thus, a force that increases or decreases the interatomic distance between the atoms of the membrane layer gives rise to stress within the membrane. For example, the membrane layer may exhibits a non-zero inherent, or intrinsic, residual stress when at equilibrium (i.e. when no or negligible differential pressure arises across the membrane). Furthermore, stresses can arise in the membrane layer e.g. due to the way in which the membrane is supported in a fixed relation to the substrate or due to an acoustic pressure wave incident on the membrane.

MEMS transducers according to the present invention are intended to respond to the acoustic pressure waves which give rise to transient stress waves on the membrane surface. Thus, it will be appreciated that the stress concentrations that may arise within a membrane layer, both when at equilibrium and when moving during use, may potentially have a detrimental impact on the performance of a transducer.

In transducers such as described above in relation to FIGS. 1a, 1b, 2 and 3, the membrane layer may be formed from a material such as silicon nitride and may be deposited to have residual stress inherent in the membrane at equilibrium. The membrane may be formed so as to be supported around substantially the whole of its periphery. The membrane can therefore be thought of as being under tension, akin to a drum skin stretched over a frame. To provide uniform behaviour and even stress distribution the membrane is thus typically formed as a generally circular structure.

Figure 1A:
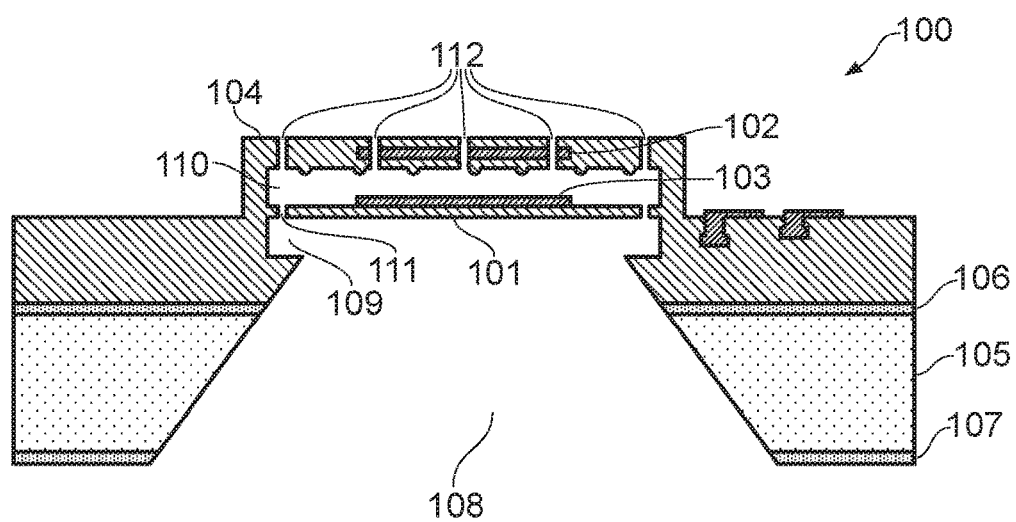
FIGS. 1a and 1b illustrate sectional and perspective views of a known MEMS microphone structure.
Figure 1B:
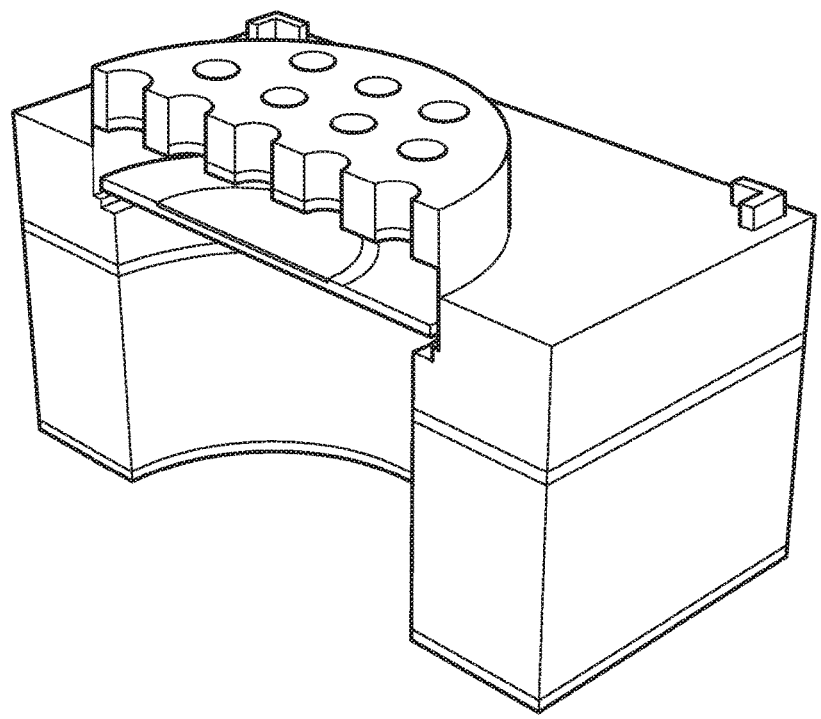
Figure 3:
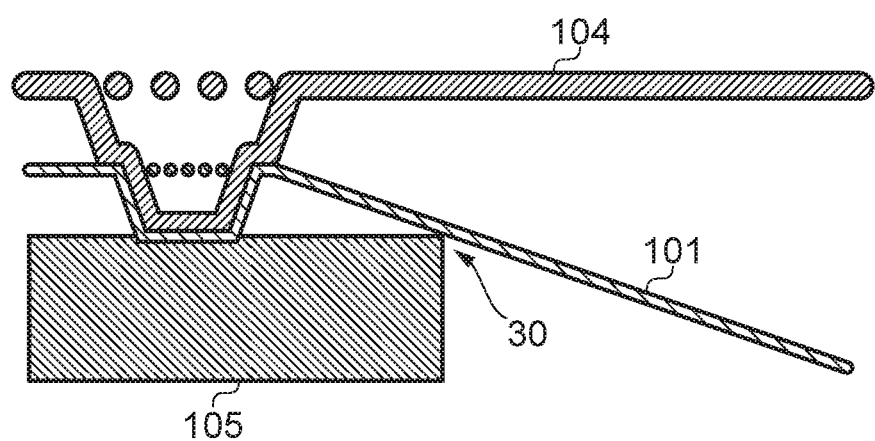
FIG. 3 illustrates deflection of a membrane in the MEMS transducer structure of FIG. 2.

For instance to form the transducer structure illustrated in FIG. 1a, one or more base layers may be formed on the substrate 105 and then a layer of sacrificial material may be deposited and patterned to form a generally circular shape. The sacrificial material serves to define the space that will form cavity 109. One or more layers may then be deposited on the sacrificial material to form the membrane 101. The bleed holes 111 may be formed in the membrane layer along with any vent structures such as described with reference to FIG. 1a or 1b. A further sacrificial material layer may then be deposited on top of the membrane and patterned to define cavity 110. The back plate layers can then deposited. To form the substrate cavity 108 a back etch may be performed. To ensure that it is the sacrificial material that defines cavity 109 and not the bulk back etch (which would be less accurate) it is preferably ensured that the opening of the substrate cavity is smaller than cavity 109 and located within the area of the cavity 109. The sacrificial material can then be removed to leave cavities 109 and 110 and release the membrane. The membrane layer(s) thus extend into the side wall structure that also supports the back-plate. The flexible membrane itself is supported and constrained on all sides and is substantially circular in shape.

Figure 6A:
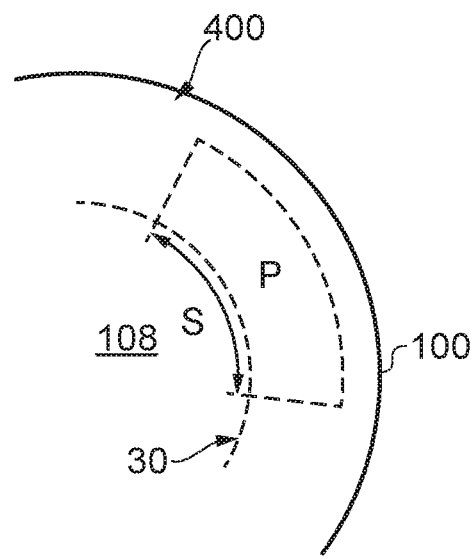
FIGS. 6a and 6b illustrate a MEMS transducer according to a first example.
Figure 6B:
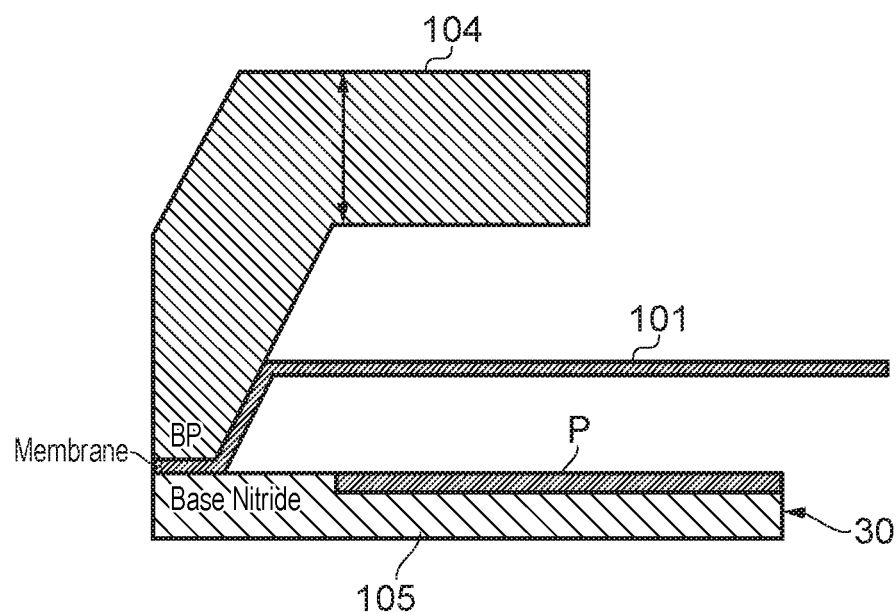

FIGS. 6a and 6b illustrate a MEMS transducer structure according to a first example. Specifically, FIG. 6a shows a part of a plan view of a flexible membrane 101 of the transducer structure whilst FIG. 6b illustrates the transducer structure in cross section. The peripheral edge 30 of the underlying cavity 108 within the substrate 105 which supports the membrane is indicated in dotted lines. It will be appreciated that the region laterally outside the cavity i.e. between the dotted line and the perimeter of the flexible membrane 101, defines an overlap region 400 of the underlying substrate. The overlap region 400 can be considered to be a region of the substrate where the membrane 101 overlies the substrate 105. An area or area portion P of the overlap region of the substrate is provided which extends from a segment S of the substrate cavity edge. In this example the portion P does not extend all the way to the perimeter of the flexible membrane.

The portion P of the substrate is provided with a plurality of recesses (not shown) in the upper surface thereof. The recesses each extend from the edge of the cavity 30 towards a perimeter of the membrane. Thus, the recesses can be considered to intersect the cavity edge 30.

From consideration of FIG. 6B it can be appreciated that if the membrane deflects sufficiently to come into contact with the underlying substrate, then the membrane will make contact with the portion P of the substrate that is provided with a plurality of recesses.

It will be appreciated that the stiction energy or stiction force or adhesive force arising between the membrane and the substrate is linearly proportional to the contact area between the membrane and the substrate. Thus, the provision of a plurality of recesses in the upper surface of the substrate effectively reduces the contact area that arises between the membrane and the substrate, since the membrane will preferably only make contact with the raised surface areas of the upper surface of the substrate in the region P. Thus, an advantage of such a configuration is that the likelihood of the membrane becoming adhered to the upper surface of the substrate in the event that the membrane makes contact with the underlying substrate, is reduced.

Figure 7A:
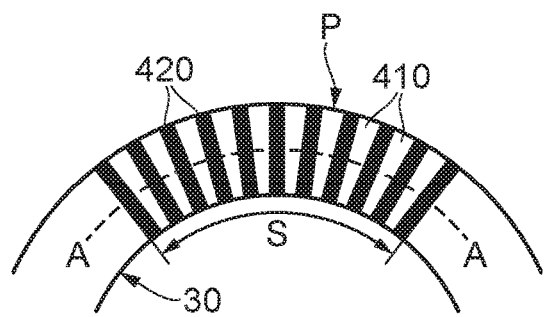
FIGS. 7a and 7b illustrate recesses provided in a portion of the upper surface of a substrate according to one example.

FIG. 7a illustrates a plan view of the upper surface of the substrate according to one example wherein the upper surface of the substrate comprises a plurality of recesses 410. In this example, the recesses comprise a plurality of channels which are defined in the upper surface of the substrate. Thus, according to the illustration shown in FIG. 7a, the recesses 410 are indicated by the white regions which are illustrated as extending between adjacent ridges 420 which are shaded.

It will be appreciated that the recesses may be formed by removing material from the upper surface of the substrate to thereby form a plurality of lower regions forming the recesses 410 that are provided between adjacent higher regions, or ridges, 420. In this case the upper surface of the ridges will be substantially coplanar with the upper surface of the rest of the substrate. Alternatively, the recesses may be formed by depositing additional material onto the surface of the substrate to form a series of ridges which extend from the edge of the cavity towards the plane of the perimeter of the overlying membrane. In this case the upper surface of the recesses or lower regions 410 will be substantially coplanar with the upper surface of the rest of the substrate.

Figure 7B:
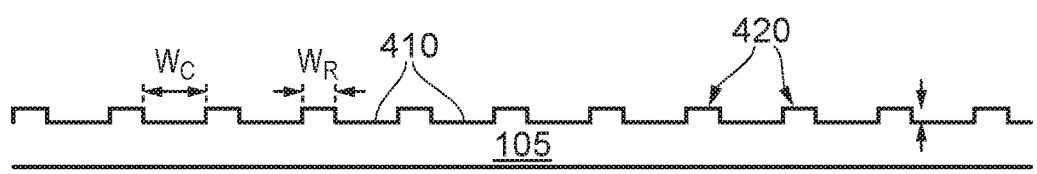

FIG. 7B shows an expanded, cross-sectional view of the example shown in FIG. 7A taken along the line A-A. For ease, the line A-A is represented as being straight in FIG. 7B although from FIG. 7A it will be appreciated that the cross section A-A actually follows a curved path. Thus, the recesses in this example comprise a series of channels having a substantially rectangular cross-section. In this example the width of the channel Wc (wherein the width is defined in a direction substantially parallel to the edge of the cavity) may be around 2 μm, whilst the width of the ridge may be around 1 μm. Thus, the channel to ridge ratio is around 2:1 in this example. The depth of the channel Dc is around 120 nm.

In the event of the membrane making contact with the substrate, the initial impact area of the substrate—in other words the available contact area that will arise in the first instance of contact between the membrane and the substrate—determines the likelihood of the membrane experiencing damage and/or failure. The smaller the initial impact area, the higher the local stress generated in the membrane and hence the likelihood of membrane damage/failure is increased. Thus, the initial impact area will be defined by the profile of the cavity edge 30 and/or by any raised substrate features near this edge that will be impacted first in the event of membrane contact.

Referring again to FIG. 4, in the case of a substrate containing no recesses, this initial impact area will be equal to the length L1 multiplied by the width W of contact between the substrate and the membrane.

Figure 8A:
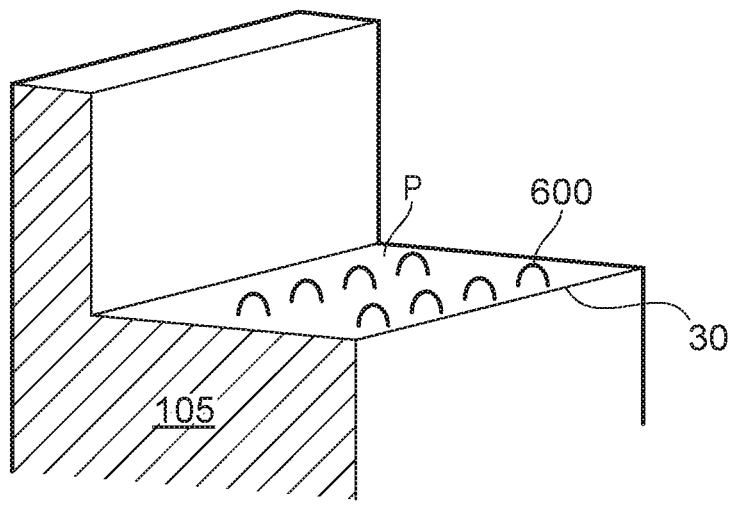
FIGS. 8a and 8b illustrate a previously proposed design wherein the overlap portion of the substrate is provided with a plurality of bumps.

Referring now to FIG. 8a which illustrates a part of a perspective view of a previously proposed design according to which a plurality of raised bumps 600 are provided on the substrate ledge—i.e. on a portion P of the overlap region between the edge of the cavity and a perimeter of the flexible membrane where the membrane overlies the upper surface of the substrate. It can be appreciated from consideration of FIG. 8b—which illustrates a cross-sectional through configuration illustrated in FIG. 8a—that if the initial contact between the membrane and the substrate is between one, or even several, of the bumps 600 which project from the upper surface of the substrate, the initial impact area will be relatively small and, thus, that relatively high regions of stress will arise within the membrane layer.

Thus, whilst it is desirable to reduce the overall contact area that arises between the substrate and the membrane in circumstances of e.g. a high pressure event, it is also desirable to maintain a sufficiently large initial impact area of the substrate in order to mitigate stress concentrations arising within the membrane on contact with the substrate.

Figure 9A:
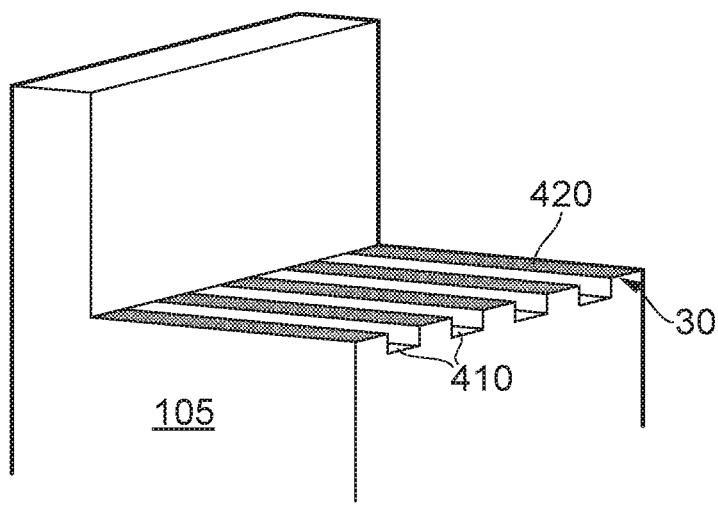

From consideration of FIG. 9a which illustrates a partial perspective view of the example shown in FIG. 7a, it will be seen that the provision of a plurality of recesses which each extend from the edge of the cavity towards the perimeter of the membrane is advantageous in that the initial impact area is defined by a line or region of contact that is formed by the plurality of raised surface areas that will be provided across the length of the segment S of the portion P. This effectively distributes the initial impact area of the substrate along the length of the segment S.

Figure 8B:
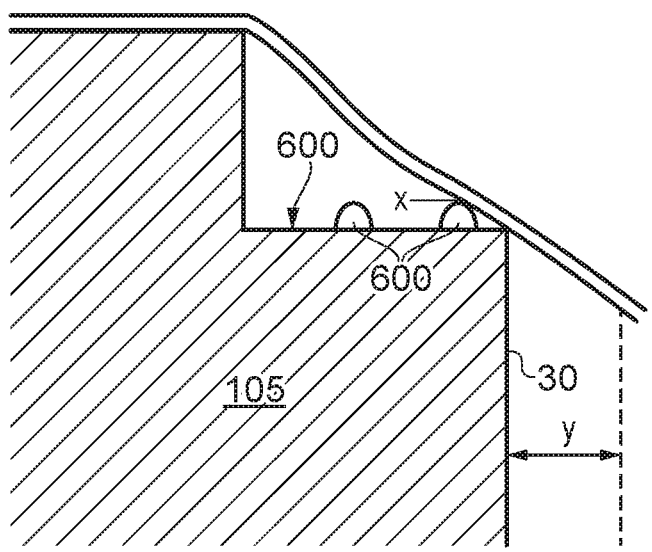
Figure 9B:
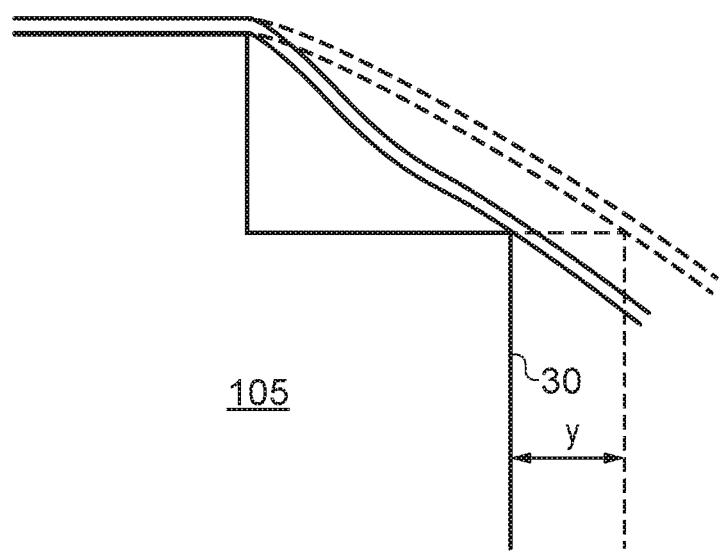

Further advantages of the examples discussed herein can be appreciated from consideration of the formation of the substrate cavity 108. Specifically, due to process limitations inherent in controlling the back-etch process used to form the cavity 108, the manufactured position of cavity edge 30 may vary from the 'as designed' position. This process variation Y in the precise position of the cavity edge 30 is illustrated in FIGS. 8b and 9b. The examples described herein may be advantageous in that the recesses intersect the cavity edge 30 and extend towards the perimeter of the flexible membrane. As such, no matter where the final position of the cavity edge is within the process variation zone, the profile and/or configuration of the cavity edge will be substantially consistent. Thus, over the range of the aforementioned process variation, the initial impact area between the membrane and the upper surface of the substrate is largely unchanged.

This is particularly the case if the recesses comprise longitudinal channels having a substantially uniform cross section.

It will be appreciated that the geometry and/or dimensions of the recesses may be selected in order to ensure that, for a given transducer design, the potential adhesive forces that arise in the event of the membrane and substrate coming into contact do not exceed the restoring forces. The adhesive forces may be at least partly determined by the likely or potential contact area between the membrane and the upper surface of the substrate. Moreover, the potential contact area will depend on the extent to which the membrane may make contact with the upper surface of the recessed regions, which is determined by the geometry—e.g. shape—and dimensions of the recesses e.g. the depth of the recesses and/or the recess to ridge ratio. The restoring forces may at least partially depend on the gradient of the remaining unstuck membrane.

Figure 7C:
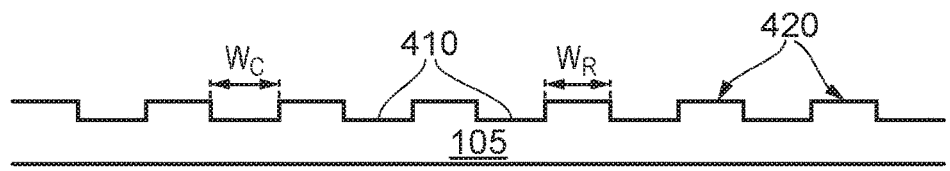
FIG. 7c illustrates a further example of recesses provided in a portion of the upper surface of a substrate.
Figure 10A:
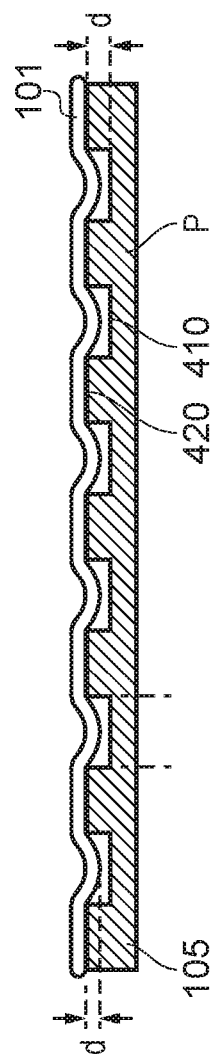
FIGS. 10a and 10b illustrate the relative contact between a membrane and a substrate.
Figure 10B:
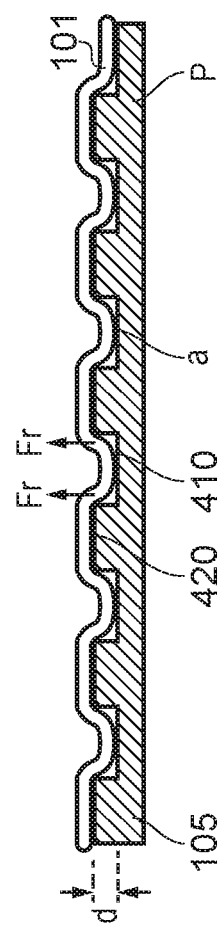

For example, FIG. 7C shows a cross-sectional view of a further example in which the channel to ridge ratio is around 1:1. Examples comprising a substrate having a portion provided with a plurality of recesses are also envisaged which exhibit a 3:1 or 4:1 ratio. However, it will be appreciated that if the width of the channel becomes too great, the likelihood that the membrane will dip into the recess and potentially make contact with the upper surface of the recesses will increase. This is illustrated in FIGS. 10a and 10b which show the relative contact between the membrane and the substrate. Thus, in FIG. 10a the channel to ridge ratio is around 1:1 and the recesses exhibit a depth of d. In the event of contact between the membrane and the substrate, the membrane does not come into contact with the upper surface of the recessed regions of the substrate. However, as shown in FIG. 10b wherein the channel to ridge ratio is around 2:1, in the event of contact between the membrane and the substrate, the membrane does make contact with the upper surface of the recessed regions of the substrate, thus generating an additional contact area a. In this event, the adhesive forces arising between the membrane and the upper surface of the recesses may become sufficient to exceed the local restoring force Fr of the membrane. The depth of the recess also partly determines if the membrane can make contact with the upper surface of the recessed regions. Preferably, the dimensions of the recesses are selected such that the membrane makes limited contact with the upper surface of the recesses. In this case, the overall contact area between the membrane and the upper surface of the substrate is reduced, thereby mitigating the risk of stiction. Alternatively, the dimensions of the recesses may be selected such that if the membrane does make contact with the upper surfaces of the recesses, the local restoring force is still greater than the total adhesive force. Thus it is possible for the channel width Wc to be defined in design such that any contact in the recessed regions generates a force less than the local restoring for Fr. This sets an upper limit on Wc.

Whilst circular membranes as illustrated in FIGS. 6 and 7 produce good device properties, the use of circular membranes tends to result in some inefficiency during fabrication in the use of the silicon wafer.

For various reasons it is most usual and/or cost effective to process areas of silicon in generally rectangular blocks of area. Thus the area on a silicon wafer that is designated for the MEMS transducer is typically generally square or rectangular in shape. This area needs to be large enough to encompass the generally circular transducer structure. This tends to be inefficient in terms of use of the silicon wafer as the corner regions of this designated transducer area are effectively unused. This limits the number of transducer structures and circuits that can be fabricated on a given wafer. It would of course be possible to fit more transducers on a wafer by reducing the size of the transducer but this would have any impact on resulting sensitivity and thus is undesirable.

Figure 4:
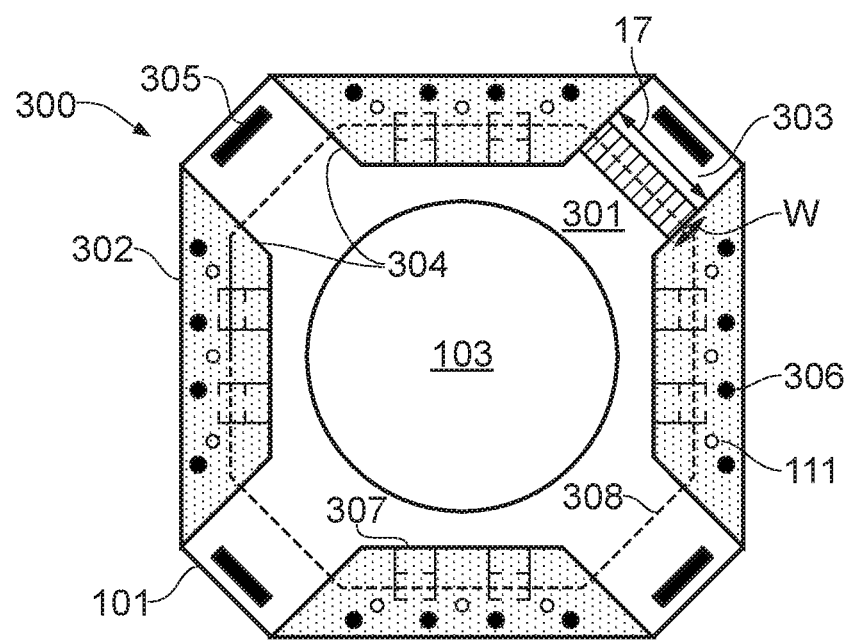
FIG. 4 illustrates a plan view of a MEMS transducer structure.
Figure 5B:
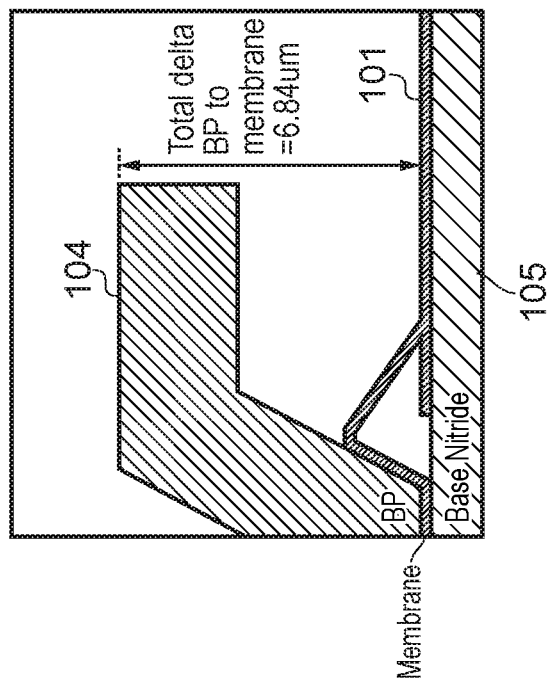
FIGS. 5a and 5b illustrate the problem of membrane stiction.
Figure 5A:
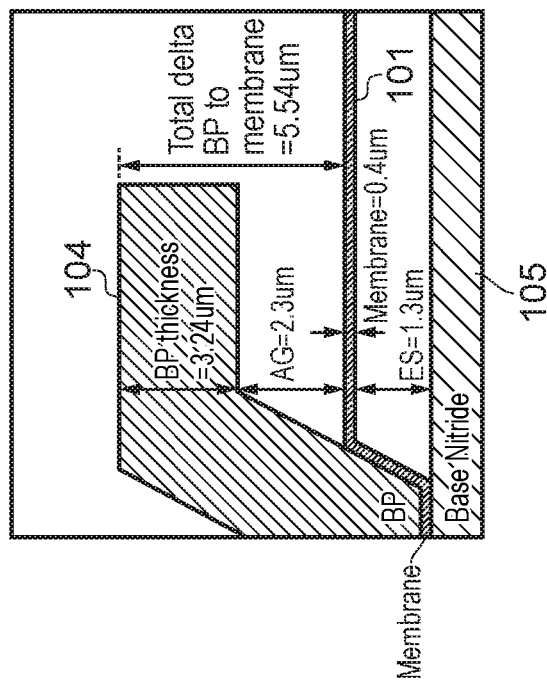

According to further examples described herein the transducer is based on a design that more efficiently utilizes a generally rectangular or square area such as that shown FIG. 4. This design requires less area for a given transducer sensitivity than an equivalent circular design.

FIG. 4 illustrates an example of a transducer 300, whereby instead of having a circular membrane a different shape is used. FIG. 4 illustrates the transducer membrane 101 and thus represents a section through the transducer although the backplate may have substantially the same shape. The membrane is not substantially circular and instead, in this example, has a polygon shape. In general the membrane has a shape that would substantially fill a square area defined by the perimeter of the membrane. In other words if one were to consider the smallest possible square area that would completely contain the membrane 101 then the membrane would cover a large proportion of such an area, for example the membrane may cover at least 90% of such a square area. It will be appreciated that for a circular membrane of diameter D the smallest such square area would have a side D. The area of the circle ($\pi \cdot D^2/4$) would thus cover about 78% of the area of such a square ($D^2$).

The whole area illustrated in FIG. 4 is provided with a layer of membrane material. However in the example illustrated in FIG. 4 the layer of membrane material is divided into a first membrane region 301, which will be referred to herein as an active membrane region or just as active membrane, and a plurality of second regions 302 which will be referred to as inactive membrane regions or inactive membrane. The inactive membrane regions 302 are illustrated by the shaded regions in FIG. 4, with the unshaded area corresponding to the active membrane 301.

The active membrane thus comprises a central area, e.g. where the membrane electrode 103 will be located, which is supported by a plurality of arms 303. In some embodiments the arms may be distributed substantially evenly around the periphery of the membrane. A generally even distribution of arms may help avoid unwanted stress concentration. In the example illustrated in FIG. 4 there are four arms 303 and thus four separate regions of inactive membrane 302, but it will be appreciated that there may be more or fewer arms in other embodiments, although preferably there will be at least three arms.

There are thus one or more channels or gaps 304 between the material of the active membrane 301 and the inactive membrane regions 302. Conveniently during manufacture a continuous layer of membrane material may be deposited and then the channels 304 may be etched through the membrane material to form the active and inactive regions.

Each arm 303 of the active membrane region 301 may comprise at least one mount 305 for supporting the membrane layer of the active region 301 with respect to the substrate and also possibly a backplate. There may also be mounts 306 within the inactive membrane regions for supporting the inactive membrane region.

The mounts 305 and 306 may take various forms. For instance the mount could comprise a sidewall of the transducer structure and the membrane layer may extend into the sidewall. In some examples however the mount may be a region where the membrane material makes contact with the substrate or a support structure that rises from the substrate. The mount may also comprise an area where the support structure for the backplate makes contact with the membrane. The membrane at the mount is thus effectively held in place and prevented from any substantial movement with respect to the substrate and/or backplate.

The material of the membrane layer can thus be deposited with intrinsic stress as described previously. The plurality of arms of the active region 301 all radiate generally away from the centre of the active membrane and thus can act to keep the membrane effectively in tension. As mentioned the arms may be evenly spaced around the active membrane. In addition the mounting points for the active membrane 301, e.g. mounts 305 may all be substantially equidistant from the centre of the active membrane—even with a generally square membrane layer. This is possible because the membrane material at the 'sides' of the square arrangement have been separated into inactive membrane regions that are not directly connected to the active membrane region. This arrangement thus means that the distribution of stress in the central portion of the active membrane is generally even, both at equilibrium and when the active membrane is deflected by an incident pressure stimulus, with most of any stress modulation being instead in the arms. The active membrane will thus behave in a similar way to a circular membrane which is constrained all around its periphery. This would not be the case were a square membrane, or the polygon membrane illustrated in FIG. 4, bounded on all sides.

Such a design is advantageous as it provides an active membrane area that has a similar response to a circular membrane with a radius equal to the distance between the centre of the active membrane and the mounts 305 of the arms. However to fabricate such a corresponding circular membrane transducer would require a larger rectangular area of the substrate. By using a design such as illustrated in FIG. 4 the area required for the transducer on a wafer may therefore be reduced compared to a circular membrane of similar performance.

Figure 11:
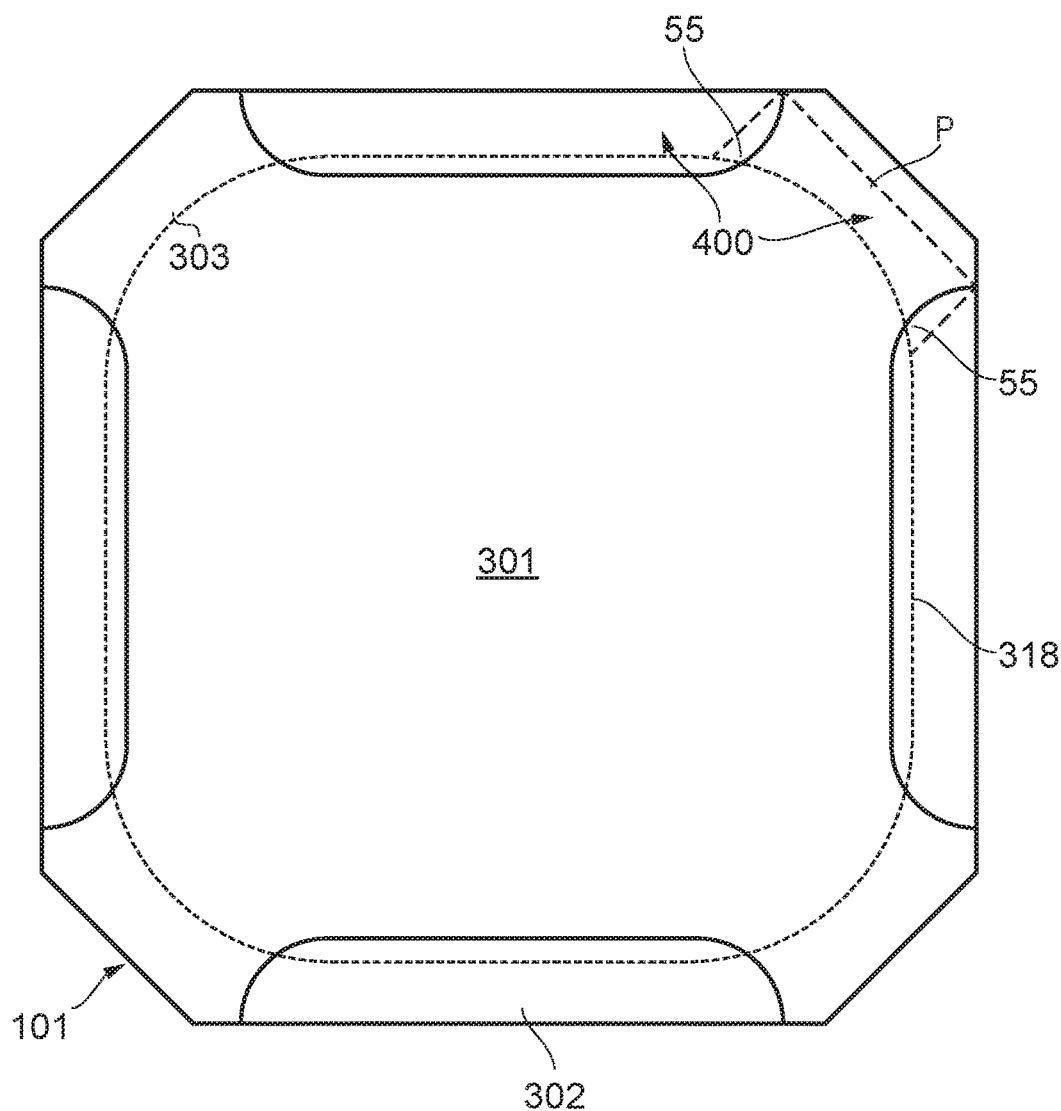
FIG. 11 illustrates a MEMS transducer according to a further example.

FIG. 11 illustrates a MEMS transducer structure according to a further example of the present invention. Specifically, FIG. 11 shows a plan view of a membrane layer 101 of the transducer structure. The membrane layer is similar to that of FIG. 4 having an active centre region 301 and a plurality of supporting arms 303 with inactive membrane regions 302. The peripheral edge 318 of the underlying cavity within the substrate which supports the membrane is shown in dotted lines. The region laterally outside the cavity i.e. between the dotted line and the perimeter of the flexible membrane defines an overlap region 400 of the underlying substrate. The overlap region 400 can be considered to be a region of the substrate where the membrane overlies the substrate 105.

A portion P of the overlap region is indicated at one of the supporting arms. The portion P of the substrate is provided with a plurality of recesses (not shown) which each extend from the edge 318 of the cavity towards the perimeter of the support arm. The recesses, which extend from the edge of the cavity towards the one or more mount structures that support the membrane relative to the substrate, may take a variety of forms. For example, the recesses may comprise a plurality of channels similar to those illustrated in FIGS. 7a, 7b and 7c.

From consideration of FIG. 11 it can be appreciated that if the membrane deflects sufficiently to come into contact with the underlying substrate, then the membrane will come into contact with the portion P of the substrate that is provided with a plurality of recesses. An advantage of such a configuration is that the likelihood of the membrane becoming adhered to the upper surface of the substrate in the event that the membrane makes contact with the underlying substrate, is reduced. As discussed above, the stiction force or adhesive force arising between the membrane and the substrate is linearly proportional to the contact area between the membrane and the substrate. Thus, the provision of a plurality of recesses in the upper surface of the substrate effectively reduces the contact area between the membrane and the substrate, since the membrane will make limited or no contact with the upper surface of the substrate in the region P of the recesses.

It can also be appreciated that an initial contact point between the active membrane area and the edge 318 of the cavity is at the edges 55 of the supporting arms 303 of the active membrane area. Thus, the edges 55 of the supporting arms 303 of the active membrane area are particularly vulnerable to damage in circumstances of a high pressure event.

Figure 12:
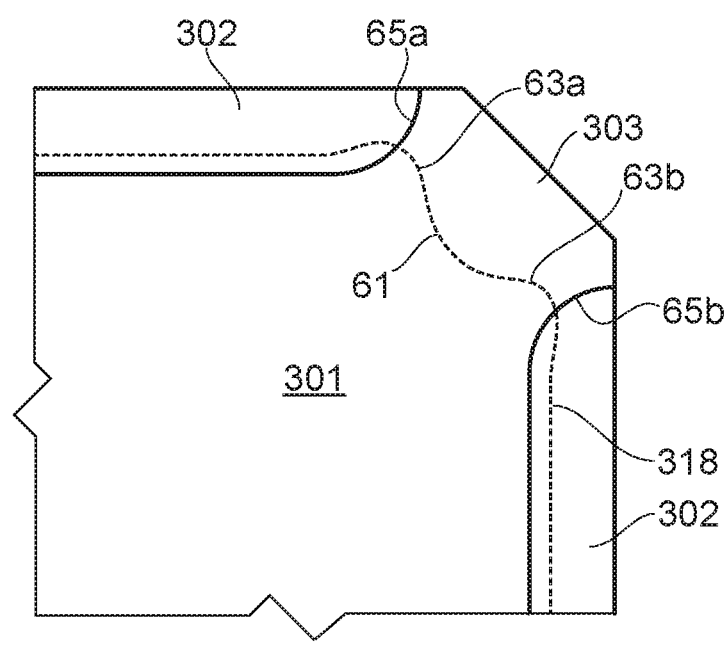
FIG. 12 illustrates a previously proposed transducer.

To mitigate this potential problem, a transducer structure as illustrated in FIG. 12 has been previously proposed. As illustrated in FIG. 12, the membrane layer is similar to that of FIGS. 4 and 11 in that the transducer comprises an active centre region 301 and a plurality of supporting arms 303 (one of which being shown in this section), with inactive membrane regions 302. The peripheral edge 318 of the underlying cavity within the substrate which supports the membrane is shown in dotted lines. However, in this example a peripheral edge 318 of the cavity defines at least one perimeter segment 61 that is convex with reference to the centre of the cavity and underlies a centre region of a support arm 303 of the membrane. The peripheral edge also defines concave segments 63a and 63b which underlie the edges of the support arm 303 (the edges 65a, 65b, being the slits between the support arms 303 of the active portion of the membrane and the inactive portions 302 of the membrane layer, as explained earlier with reference to FIG. 4). It will be appreciated that should the flexible membrane deflect significantly towards the underlying substrate and cavity during use, for example in response to a high acoustic input signal, or a device being dropped, a centre region of the supporting arm 303 (across the width of the support arm 303) will make contact with the convex segment 61 in the peripheral edge of the cavity in the substrate, prior to the edges 65 of the supporting arm 303 making contact with the concave segments of the peripheral edge. In this way, since the centre region of the support arm 303 makes contact first, this inherently stronger centre region absorbs the energy, thus reducing the likelihood of the membrane tearing or being damaged at its edges. In addition, the relatively weak part of the membrane (i.e. the edges 65a, 65b of the support arms 303) are less likely to make contact with the cavity edge 318.

However, whilst such transducer designs have been shown to demonstrate an improvement in the robustness of the transducer, the level of stiction forces—arising in the event of the membrane making contact with the convex edge portion—is seen to increase in some examples.

Figure 13:
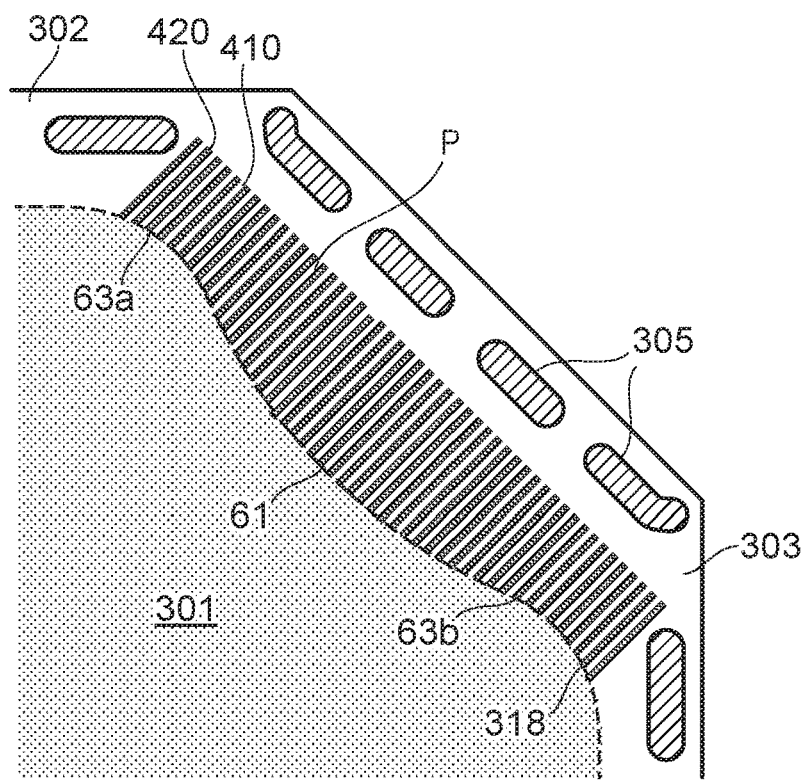
FIG. 13 illustrates a MEMS transducer according to a further example.

FIG. 13 illustrates a MEMS transducer structure according to a further example. Specifically, FIG. 13 shows a plan view of a membrane layer 101 of the transducer structure. The membrane layer is similar to that of FIG. 12 having an active centre region 301 and a plurality of supporting arms 303 with inactive membrane regions 302. The peripheral edge 318 of the underlying cavity within the substrate which supports the membrane is shown in dotted lines. The peripheral edge 318 of the cavity defines a perimeter segment 61 that is convex with reference to the centre of the cavity and underlies a centre region of a support arm 303 of the membrane. The peripheral edge also defines concave segments 63a and 63b which underlie the edges of the support arm 303.

A portion P of the overlap region of the substrate is defined so as to be beneath the active region of the membrane that forms the support arm 303. The portion P of the substrate is provided with a plurality of recesses 410 formed in the upper surface thereof. The recesses comprise a plurality of channels 410.

An advantage of the FIG. 13 example is that the transducer demonstrates an improvement in robustness due to the shape of the perimeter of the cavity as discussed above with respect to FIG. 12. Indeed, it will be appreciated that the location of the line/region of initial impact is not significantly altered by the provision of the channels. As such, the robustness improvements demonstrated with respect to FIG. 12 may be advantageously preserved. Furthermore, the increased potential contact area between the membrane and the upper surface of the substrate that arises as a consequence of the extended convex region 61 is beneficially mitigated by presence of the plurality of channels. Specifically, the provision of the plurality of channels advantageously reduces the potential contact area between the membrane and the substrate and, thus, the adhesion force arising between the membrane and the substrate in the event that the membrane makes contact with the substrate. Beneficially, the adhesion or stiction force Fs will be less than the restoring force Fr which tends to restore the membrane to the equilibrium position such that the likelihood of stiction is reduced.

The location and area of the, or each, area portion P of the substrate that is provided with a plurality of recesses can be beneficially selected according to the particular design of the transducer. Thus, for example, in the case of the circular membrane shape illustrated in FIG. 7, it may be desirable for the area portion of the substrate P that is provided with a plurality of recesses to extend all the way around the cavity. Alternatively a plurality of substrate portions may be provided which are disposed at intervals with respect to the edge of the cavity.

In the case of the substantially square-shaped membrane layer shown in FIGS. 8 and 10, it is particularly advantageous to provide a substrate portion having a plurality of recesses beneath each of the supporting arms 303. Furthermore, the substrate portion P that is provided with a plurality of recesses may be located so as to underlie only a part of the support arms. For example, in the case of the transducer structure shown in FIG. 10, wherein the peripheral edge 318 of the cavity defines a perimeter segment 61 that is convex with reference to the centre of the cavity as well as concave segments 63a and 63b which underlie the edges of the support arm 303, it may only be necessary to provide the convex segment 61 of the substrate with a plurality of recesses.

Figure 16:
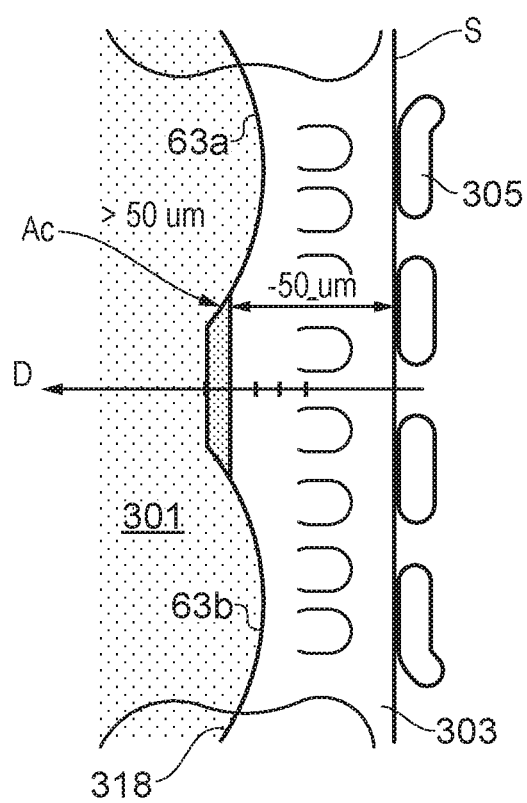
FIG. 16 illustrates the determination of a critical adhesion area.

A partial plan view of an example transducer is illustrated in FIG. 16. The peripheral edge of the underlying cavity defines concave segments 63a and 63b which underlie the edges of the support arm 303. The critical adhesion area Ac of the substrate where Fr=Fs is identified may be defined to be a region of the substrate. Thus, it can be appreciated that a reduction in the contact area between the membrane and the substrate will be required in order for Fs<Fr to apply. To achieve this, rather than increase the cavity to define a smaller ledge or overlap region (which may have a detrimental effect on the robustness of the device), it is possible to provide the overlap portion including the critical adhesion area Ac with a plurality of recesses, as discussed above. Thus, the portion P of the substrate that is provided with a plurality of recesses can be beneficially selected with consideration of the critical adhesion area.

Figure 14:
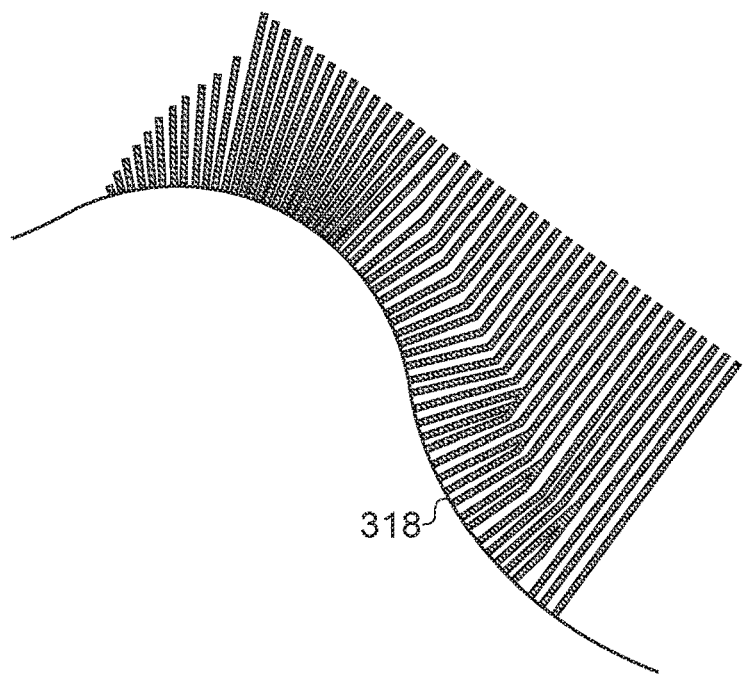
FIG. 14 illustrates an alternative recess configuration according to a further example.

In the FIG. 13 example the channels exhibit a substantially longitudinal form and extend from the edge of the cavity 318 towards the mount structures 305. The mount structures can be considered to define a supporting edge of the active membrane. In this example the channels extend substantially orthogonally from the supporting edge defined by the line of the mount structures. However, it will be appreciated that other arrangements are envisaged—such as is shown in FIG. 14—in which the channels or recesses may extend e.g. substantially orthogonally with respect to the edge of the cavity 318. Thus, the channels may terminate in a manner that is substantially conformal to the edge shape of the substrate cavity.

It will be appreciated that the depth and/or ratio between the width of the recess forming a lower region and the width of the adjacent ridges forming a high region, may be varied according to different examples. Furthermore, the profile or shape of the recesses may take a variety of forms. Thus it is envisaged that the recesses may be elliptical in shape wherein a portion of the ellipse intersects the edge of the cavity.

The configuration of the recesses, for example in terms of the pitch, width and length, is a trade-off between obtaining adequately large impact area and preventing stiction. The membrane will react to incoming acoustic pressure waves by deflecting by an amount dependent on elastic restoring forces arising from the elasticity of the membrane. If the pressure is high enough then part of the membrane may make contact with an area, termed the impact area, of the underlying substrate at the periphery of the cavity in the substrate. On removal of the pressure, the membrane will tend to return to its equilibrium condition in response to the elastic restoring forces. However if the contact area is large enough, the membrane may remain attached to the substrate die to stiction or similar effects. Adhesive forces will exert a certain force Fs per unit area of the contact area.

Figure 15A:
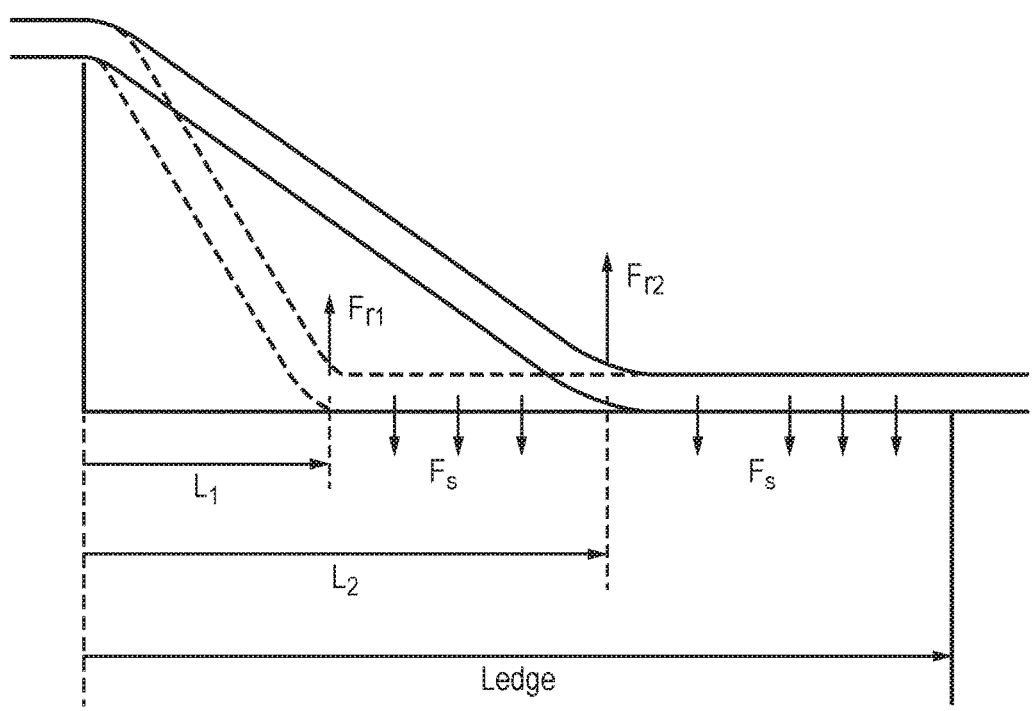
FIG. 15a illustrates the membrane and the restoring forces for two different contact areas.

FIG. 15a illustrates the membrane and the restoring forces for two different contact areas extending from the edge of the substrate cavity to distance L1 and L2 respectively from the support structure of the membrane. Assuming there is no recess, a stiction force Fs per unit area is present wherever the membrane contacts the substrate (where, to be precise, any overlying layer such as oxide grown on the original substrate material is taken to be part of the substrate structure). A restoring force Fr1 attempts to separate the membrane from the surface where it leaves the substrate at distance L1. A restoring force Fr2 attempts to separate the membrane from the surface where it leaves the substrate at distance L2. Generally where L1 is less than L2, the restoring force Fr1 will be greater than the restoring force Fr2. Firstly, the elastic extension of the membrane in the L1 case will be more than the extension in the L2 case. Second, the direction of approach of the L1 case will be more normal to the substrate than that of the L2 case, further increasing the vertical component of the force.

Thus qualitatively, increasing the fraction of the area occupied by recesses in the surface will tend to decrease the contact area and thus decrease the stiction forces and will tend to enable the restoring forces to be more successful in lifting the membrane off the surface against these decreased stiction forces. However if the recesses increase too much then the actual impact contact area may decreased too much and give rise to too much local stress on initial impact.

More precisely, while the force Fs is present across the whole impact area, the force necessary to start to peel the membrane off the surface near L1 or L2 will depend only on forces local to the edge of the contact area. Calculation of the extent to which the restoring forces may peel the membrane off the substrate distances are best performed in terms of an analysis of the energy stored in the structure. There will be a first energy term Es due to the stiction energy per unit area of the actual contact surface. To total stiction energy from a distance L of the membrane-substrate contact edge from the membrane support to a distance Ledge of the cavity edge from the support will be proportional to Ledge—L and this energy Es will increase as L decreases. There will be a second energy term Er due to the stored elastic energy in the membrane, which will tend to increase as L decreases, increasing more rapidly as L gets smaller.

Figure 15B:
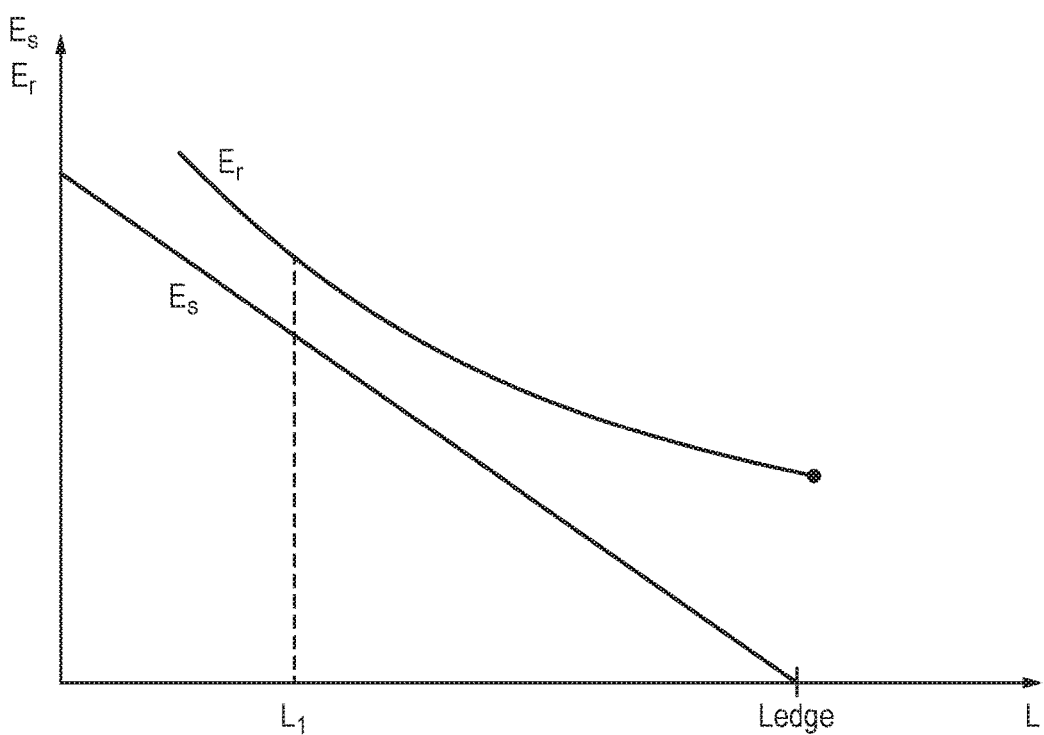
FIG. 15b provides a graphical illustration of the stiction energy and elastic energy stored in a membrane structure.

Curves for Es and Er versus L are illustrated in FIG. 15b. For the restoring force to move the contact edge a distance δL towards Ledge, the membrane must supply an energy δEs=Fs·δL to break the stiction bonds in that incremental distance. For this to be able to occur, the slope of the elastic energy curve at the point L δE/δL must be enough to supply that incremental energy δE. Thus the restoring forces will only be able to peel off the membrane to the point where the slopes of the two energies versus L are equal, in this example at L=L1.

Figure 15C:
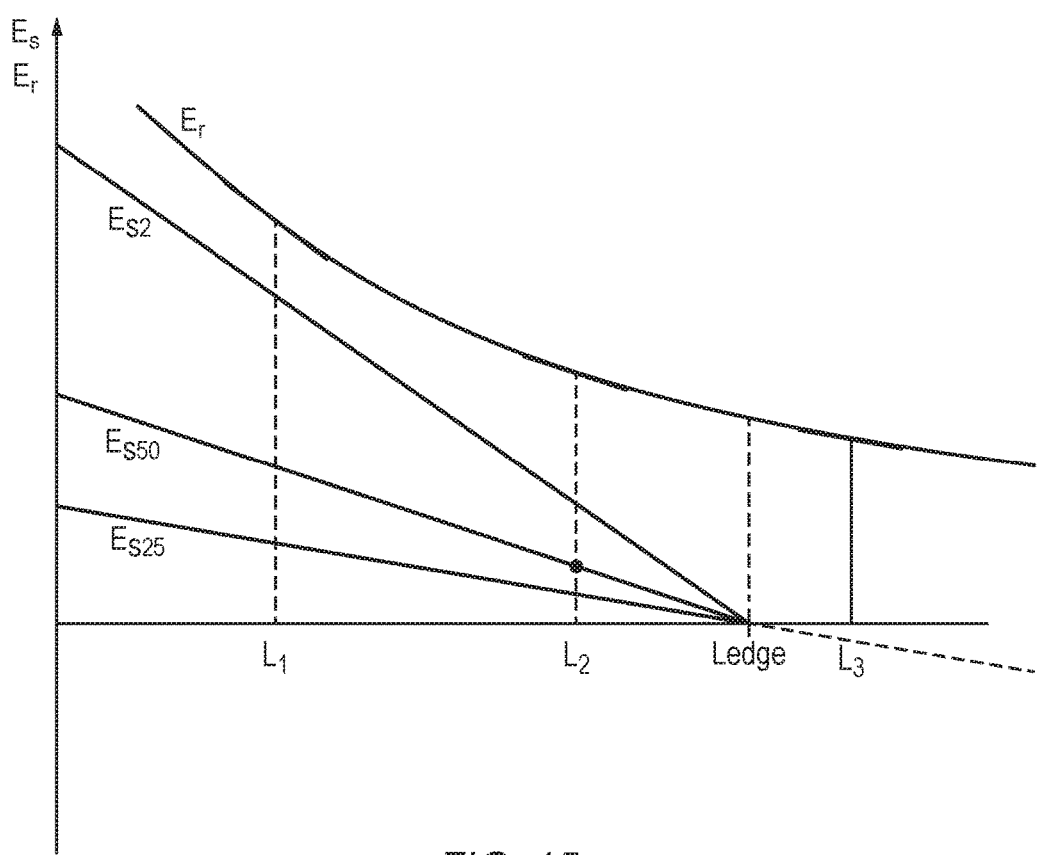
FIG. 15c illustrates the s stiction energy curves for different percentage recess coverage of the impact area.

For a surface with recesses, for a given L, the stiction energy will be proportional to the proportion of the potential contact area not occupied by recesses. The restoring force will be largely independent of the recesses (though some reduction due to two-dimensional force distributions in the membrane may occur for very wide recesses). FIG. 15c illustrates the s stiction energy curves Es, Es50, Es75 for 0%, 50% and 75% recess coverage of the impact area respectively. The 0% curve shows the stiction energy curve slope equalling that of the elastic energy curve at L=L1, so after an initial deflection of the membrane to L1, it would not recover at all. For 50% coverage, the slopes are equal at L2, so the membrane would relax to L=L2, but still be stuck onto the surface. For 75% recess coverage, the equality of slope is only obtained for extrapolated curves for a value of L of L3, being greater than Ledge, so the membrane would be fully released by the restoring forces for any L less than Ledge. Indeed the membrane would still be fully released even if manufacturing tolerances increased Ledge to a value nearly equal to L3.

For similar membranes, the required percentage recess coverage may tend to be higher for larger Ledge as the restoring force will tend to be smaller. In the above example, if Ledge were L2 then a 50% coverage would have sufficed. In some embodiments the percentage recess coverage may be reduced towards the support and away from the edge, e.g. the recesses may be tapered or may splay out. This may provide a greater actual impact area away from the cavity edge corresponding to the greater membrane distortion when subject to higher magnitude pressure impulses and thus improve ruggedness with respect to the initial impact.

It is noted that references herein to the centre of a cavity are intended to refer to a centre of a plane across the cavity parallel to the undistorted membrane.

It is also noted that references herein to the term convex are intended to cover perimeter segments that are not only curved paths that provide a convex shape (i.e. an outline or surface that is smooth or a continuous curve like the exterior of a circle or sphere), but also perimeter segments comprising at least first and section linear sections that meet at one or more points to define a convex region. The term convex is also intended to comprise a perimeter segment having a plurality of bitwise linear sections, which together form a convex perimeter segment or form a convex curved path. As such, in the example of FIG. 10, and the other embodiments described herein, a convex segment may comprise a curved path, or a series of two or more bitwise linear portions.

It should be understood that the various relative terms upper, lower, top, bottom, underside, overlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

In the embodiments described herein, according to some examples the cavity comprises a through-hole through the substrate.

In some examples the periphery of the cavity comprises at least one convex and concave segment, and wherein the periphery of the through-hole has a circular or rectangular or pentagonal or octagonal shape.

In an embodiment comprising a plurality of supporting arms, a corresponding plurality of convex and/or concave segments may be provided as described above. In an embodiment having a plurality of supporting arms, the supporting arms may be spaced evenly around the active central region of the membrane.

In some examples the membrane is generally square or rectangular in shape, and wherein an active centre region of the membrane is under intrinsic stress.

In the embodiments described herein, a cross-section of the periphery of the cavity lies in a plane parallel to the surface of the substrate.

A MEMS transducer according to the embodiments described here may comprise a capacitive sensor, for example a microphone.

A MEMS transducer according to the embodiments described here may further comprise readout circuitry such as a low-noise amplifier, voltage reference and charge pump for providing higher-voltage bias, analogue-to-digital conversion or output digital interface or more complex analogue and/or digital processing or circuitry, or other components. There may thus be provided an integrated circuit comprising a MEMS transducer as described in any of the embodiments herein.

One or more MEMS transducers according to the embodiments described here may be located within a package. This package may comprise one or more sound ports. A MEMS transducer according to the embodiments described herein may be located within a package together with a separate integrated circuit comprising readout circuitry which may comprise analogue and/or digital circuitry such as a low-noise amplifier, voltage reference and charge pump for providing higher-voltage bias, analogue-to-digital conversion or output digital interface or more complex analogue or digital signal processing.

According to another aspect, there is provided an electronic device comprising a MEMS transducer according to any of the embodiments described herein. An electronic device may comprise, for example, at least one of: a portable device; a battery powered device; an audio device; a computing device; a communications device; a personal media player; a mobile telephone; a games device; and a voice controlled device.

According to another aspect, there is provided an integrated circuit comprising a MEMS transducer as described in any of the embodiments herein.

According to another aspect, there is provided a method of fabricating a MEMS transducer, wherein the MEMS transducer comprises a MEMS transducer as described in any of the embodiments herein.

Furthermore, in the embodiments described herein, it will be appreciated that a transducer may comprise other components, for example electrodes, or a backplate structure, wherein the flexible membrane layer is supported with respect to said backplate structure. The backplate structure may comprises a plurality of holes through the backplate structure.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

The MEMS transducer may be formed on a transducer die and may in some instances be integrated with at least some electronics for operation of the transducer.

In the embodiments described above it is noted that references to a transducer element may comprise various forms of transducer element. For example, a transducer element may comprise a single membrane and back-plate combination. In another example a transducer element comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprises different individual transducers positioned to receive acoustic signals from different acoustic channels.

It is noted that in the embodiments described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. However, it is noted that the embodiments are also intended to embrace the output signal being derived by monitoring piezo-resistive or piezo-electric elements or indeed a light source. The embodiments are also intended to embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, PDAs and personal computers. Embodiments may also be used in voice activated or voice controlled devices. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfill the functions of several units recited in the claims. Any reference signs in the claims shall not be construed so as to limit their scope.

The invention claimed is:

1. A MEMS transducer comprising:
a substrate having a cavity;
a membrane layer supported relative to the substrate to define a flexible membrane;
an upper surface of the substrate comprising an overlap region between an edge of the cavity and a perimeter of the flexible membrane where the flexible membrane overlies the upper surface of the substrate,
wherein a plurality of recesses are formed in at least one portion of the overlap region of the upper surface of the substrate, each of the recesses being defined so as to extend from the edge of the cavity towards the perimeter of the flexible membrane.

2. A MEMS transducer as claimed in claim 1, wherein the recesses comprise a plurality of channels.

3. A MEMS transducer as claimed in claim 2, wherein the channels exhibit a square or rectangular cross section.

4. A MEMS transducer as claimed in claim 1, wherein the recesses extend in a direction that is orthogonal to the perimeter of the flexible membrane.

5. A MEMS transducer as claimed in claim 1, wherein the recesses extend in a direction that is orthogonal to the edge of the cavity.

6. A MEMS transducer as claimed in claim 1, wherein a ratio of a width of a given recess to the width of an adjacent ridge provided in the upper surface of the substrate is between 1:1 and 4:1.

7. A MEMS transducer as claimed in claim 1, wherein the portion of the overlap region of the upper surface of the substrate that is provided with the plurality of recesses extends all the way around the region laterally outside the cavity.

8. A MEMS transducer structure as claimed in claim 1, comprising the substrate having a cavity, wherein a peripheral edge of the cavity defines at least one perimeter segment that is convex with reference to a centre of the cavity.

9. A MEMS transducer as claimed in claim 8, wherein the peripheral edge of the cavity further defines at least another perimeter segment that is concave with reference to the centre of the cavity.

10. A MEMS transducer as claimed in claim 9, wherein the flexible membrane comprises an active central region and a plurality of support arms which extend laterally from the active central region for supporting the active central region of the flexible membrane.

11. A MEMS transducer as claimed in claim 10, wherein the convex segment of the peripheral edge of the cavity underlies a centre region of a support arm of the flexible membrane.

12. A MEMS transducer as claimed in claim 10, wherein one said portion of the overlap region of the upper surface of the substrate that is provided with the plurality of recesses underlies a centre region of a support arm of the flexible membrane.

13. A MEMS transducer as claimed in claim 1, wherein a geometry and/or dimensions of the recesses are selected such that Fs<Fr, wherein Fs is an adhesive force arising between the flexible membrane and the substrate in use following a deflection of the flexible membrane which causes the flexible membrane and the substrate to come into contact, and Fr is a restoring force on the flexible membrane that tends to restore the flexible membrane to an equilibrium position.

14. A MEMS transducer as claimed in claim 1, wherein the portion of the overlap region of the upper surface of the substrate that is provided with the plurality of recesses includes a critical adhesion area, wherein the critical adhesion area is defined as the region of the overlap region where an adhesion force, Fs, is greater than or equal to a local restoring force, Fr, between the flexible membrane and the substrate when no recesses are provided on the substrate.

15. A MEMS transducer as claimed in claim 1 wherein said transducer comprises a capacitive sensor, such as a capacitive microphone.

16. A MEMS transducer as claimed in claim 15 further comprising readout circuitry, wherein the readout circuitry may comprise one or more of analogue and digital circuitry.

17. A MEMS transducer as claimed in claim 1 wherein the transducer is located within a package having a sound port.

18. An electronic device comprising a MEMS transducer as claimed in claim 1, wherein said device is at least one of: a portable device; a battery powered device; an audio device; a computing device; a communications device; a personal media player; a mobile telephone; a games device; and a voice controlled device.

19. An integrated circuit comprising a MEMS transducer as claimed in claim 1 and readout circuitry.

* * * * *

UNITED STATES PATENT AND TRADEMARK OFFICE
CERTIFICATE OF CORRECTION

PATENT NO. : 10,450,189 B2
APPLICATION NO. : 15/810592
DATED : October 22, 2019
INVENTOR(S) : Hanley et al.

Page 1 of 1

It is certified that error appears in the above-identified patent and that said Letters Patent is hereby corrected as shown below:

In the Claims

Column 17 Lines 54-Column 18 Lines 1-2 Please amend Claim 8 as follows:
8. A MEMS transducer as claimed in claim 1, comprising the substrate having a cavity, wherein a peripheral edge of the cavity defines at least one perimeter segment that is convex with reference to a centre of the cavity.

Signed and Sealed this
Twenty-third Day of June, 2020

Andrei Iancu
*Director of the United States Patent and Trademark Office*